(12) United States Patent
Engin et al.

(10) Patent No.: US 10,437,666 B2
(45) Date of Patent: Oct. 8, 2019

(54) INTEGRATED CIRCUIT DEVICE AND METHOD FOR READING DATA FROM AN SRAM MEMORY

(71) Applicant: NXP B.V., Eindhoven (NL)

(72) Inventors: Nur Engin, Eindhoven (NL); Ajay Kapoor, Eindhoven (AT)

(73) Assignee: NXP B.V., Eindhoven (NL)

( * ) Notice: Subject to any disclaimer, the term of this patent is extended or adjusted under 35 U.S.C. 154(b) by 429 days.

(21) Appl. No.: 14/820,396

(22) Filed: Aug. 6, 2015

(65) Prior Publication Data

US 2017/0039102 A1 Feb. 9, 2017

(51) Int. Cl.
| | |
|---|---|
| *G11C 29/50* | (2006.01) |
| *G06F 11/10* | (2006.01) |
| *G11C 11/419* | (2006.01) |
| *G11C 29/42* | (2006.01) |
| *G11C 29/52* | (2006.01) |
| *G11C 29/04* | (2006.01) |

(52) U.S. Cl.
CPC ...... *G06F 11/1068* (2013.01); *G06F 11/1048* (2013.01); *G11C 11/419* (2013.01); *G11C 29/42* (2013.01); *G11C 29/50* (2013.01); *G11C 29/52* (2013.01); *G11C 2029/0411* (2013.01)

(58) Field of Classification Search
CPC ............. G06F 11/1076; G06F 11/1008; G06F 11/106; G06F 11/1068; G06F 11/1048; H05K 999/99; G11C 2029/0411; G11C 29/52; G11C 29/50; G11C 11/419; G11C 29/42; G11C 29/0411
USPC ........................................................ 714/764
See application file for complete search history.

(56) References Cited

U.S. PATENT DOCUMENTS

| | | | |
|---|---|---|---|
| 5,058,116 A * | 10/1991 | Chao | G06F 11/1064 |
| | | | 711/E12.048 |
| 5,355,342 A | 10/1994 | Ueoka | |
| 5,428,956 A * | 7/1995 | Maus | F01N 9/00 |
| | | | 374/E7.021 |
| 6,278,633 B1 * | 8/2001 | Wong | G11C 7/1039 |
| | | | 365/185.03 |
| 7,043,679 B1 | 5/2006 | Keltcher et al. | |
| 7,093,156 B1 | 8/2006 | Shubat et al. | |
| 7,203,873 B1 | 4/2007 | Adams et al. | |

(Continued)

FOREIGN PATENT DOCUMENTS

| | | |
|---|---|---|
| WO | 2009032945 A1 | 3/2009 |
| WO | 2012039983 A1 | 3/2012 |

OTHER PUBLICATIONS

Motwani, Ravi et al.; Low Density Parity Check (LDPC) Codes and the Need for Stronger ECC; pp. 1-18; Aug. 2011.

(Continued)

*Primary Examiner* — Samir Rizk
*Assistant Examiner* — Enam Ahmed (57) ABSTRACT

In accordance with an embodiment of the invention, an IC device is disclosed. In the embodiment, the IC device includes an array of bit cells of static random-access memory (SRAM), a multi-level digitization module configured to generate a value in a range of values from a bit cell in the array of bit cells, the range of values including more than two discrete values, an output buffer configured to store the generated values, and an error correction code (ECC) decoder configured to output error corrected values based on the stored values.

20 Claims, 8 Drawing Sheets

(56) References Cited

U.S. PATENT DOCUMENTS

| | | | |
|---|---|---|---|
| 7,237,175 B2 | 6/2007 | Hatakenaka et al. | |
| 8,347,176 B2 | 1/2013 | Resnick et al. | |
| 8,898,548 B1 | 11/2014 | Mullendore et al. | |
| 9,424,952 B1* | 8/2016 | Seok | G11C 11/417 |
| 9,548,117 B2* | 1/2017 | Ma | G11C 13/0069 |
| 9,703,632 B2 | 7/2017 | Thoen | |
| 9,778,983 B2 | 10/2017 | Engin et al. | |
| 2004/0017711 A1* | 1/2004 | Kang | G11C 11/412 365/202 |
| 2004/0083334 A1 | 4/2004 | Chang et al. | |
| 2005/0044467 A1 | 2/2005 | Leung et al. | |
| 2005/0251728 A1 | 11/2005 | Stocken | |
| 2006/0008255 A1* | 1/2006 | Yen | G11B 20/10009 386/318 |
| 2007/0283193 A1 | 12/2007 | Lewis et al. | |
| 2008/0133994 A1 | 6/2008 | Oh | |
| 2009/0043951 A1* | 2/2009 | Shalvi | G11C 11/56 711/103 |
| 2009/0094504 A1* | 4/2009 | Sadakata | G06F 11/1032 714/764 |
| 2009/0125790 A1 | 5/2009 | Iyer et al. | |
| 2009/0144598 A1 | 6/2009 | Yoon et al. | |
| 2009/0193301 A1* | 7/2009 | Ito | G11C 11/406 714/704 |
| 2010/0165730 A1 | 7/2010 | Naftali et al. | |
| 2010/0269022 A1* | 10/2010 | Clark | G06F 9/3867 714/764 |
| 2011/0032758 A1 | 2/2011 | Rak et al. | |
| 2011/0047408 A1 | 2/2011 | Gille et al. | |
| 2011/0302476 A1* | 12/2011 | Lee | G11C 11/5628 714/763 |
| 2012/0324314 A1 | 12/2012 | Seshadri et al. | |
| 2013/0179751 A1 | 7/2013 | Linstadt | |
| 2013/0254627 A1* | 9/2013 | Jeddeloh | G06F 3/0616 714/764 |
| 2014/0047301 A1 | 2/2014 | Kurata | |
| 2014/0068365 A1 | 3/2014 | Chen et al. | |
| 2014/0164873 A1* | 6/2014 | Guyot | G06F 11/08 714/764 |
| 2014/0281810 A1* | 9/2014 | Gifford | G06F 11/106 714/764 |
| 2014/0376305 A1* | 12/2014 | Bai | G11C 11/417 365/156 |
| 2015/0100847 A1* | 4/2015 | Ojalvo | G06F 11/1068 714/764 |
| 2015/0301887 A1* | 10/2015 | Zhang | H03M 13/1102 714/764 |
| 2016/0132391 A1 | 5/2016 | Thoen | |
| 2016/0141037 A1* | 5/2016 | Kim | G11C 29/52 714/764 |
| 2016/0274969 A1* | 9/2016 | Chen | H03M 13/45 |
| 2016/0274970 A1* | 9/2016 | Earhart | G06F 11/1068 |
| 2017/0039104 A1 | 2/2017 | Kapoor et al. | |

OTHER PUBLICATIONS

M. H. Abu-Rahma and M. Anis, "Nanometer Variation-Tolerant SRAM", 5 DOI: 10.1007/978-1-4614-1749-1_2, © Springer Science+Business Media New York; 2013.

Gabor Gyepes et al.; "An On-chip Dynamic Supply Current Monitor for Testing of Digital Circuits", 23th Conference Radioelektronika Apr. 16-17, 2013, Pardubice, Czech Republic.

M. Y. Hsiao, "Class of Optimal Minimum odd-Weight-Column SEC-DED Codes", IBM Journal of Research and Development, vol. 14, No. 4, Jul. 1970, pp. 395-401.

Kai Zhao et al.; "LDPC-in-SSD: Making Advanced Error Correction Codes Work Effectively in Solid State Drives", 11th USENIX Conference on File and Storage Technologies (FAST 13), 2013, https://www.usenix.org/conference/fast13/technical-sessions/presentation/zhao.

European Search Report, 16180734.2, dated Nov. 11, 2016.
European Search Report, 16180731.8, dated Nov. 9, 2016.
European Search Report, 16180733.4, dated Nov. 17, 2016.
Gallager, R.G., "Low-Density Parity-Check Codes"; MIT Press, 1963., Low-Density Parity-Check Codes_ MIT Press, 1963.
Huifang Qin; "Deep Sub-Micron SRAM Design for Ultra-Low Leakage Standby Operation",EECS Department University of California, Berkeley, Technical Report No. UCB/EECS-2007-74, May 23, 2007.
Berrou, C., Glavieux et al.; "Near Shannon limit error-correcting coding and decoding: Turbo-codes", ICC '93 Geneva, Conference Record, May 1993.
Shao, R.Y. et al.; "Two simple stopping criteria for turbo decoding"; IEEE Trans. Commun., vol. 47, pp. 1117-1120, Aug. 1999.
Li, J. et al.; "Early stopping for LDPC decoding: convergence of mean magnitude (CMM)", IEEE Communications Letters, vol. 10, Issue: 9, 2006, pp. 667-669.
Mavis, D.G. et al. "Multiple Bit Upsets and Error Mitigation in Ultra Deep Submicron SRAMs", Microelectronics Research Development Corporation, 12 pgs. (Jul. 17, 2008).
"Memory scrubbing", Wikipedia, 3 pgs, retrieved from the internet at Jul. 28, 2014: http://en.wikipedia.org/wiki/Memory_scrubbing.
Scheick, L.Z. et al. "SEU Evaluation of SRAM Memories for Space Applications", IEEE Trans. Nuclear Science, 3 pgs. (2001).
"ECC Memory", Wikipedia, 11 pgs., retrieved from the internet 4-22-215 at: http://en.wikipedia.org/wiki/ECC_memory.
Mukherjee, S. et al. "Cache Scrubbing in Microprocessors: Myth and Necessity?", 10th International Symposium on Pacific Rim Dependable Computing, pp. 1-6 (Mar. 2004).
Kobayashi, H. et al. "Alpha Particle and Neutron-inducded Soft Error Rates and Scaling Trends in SRAM", IEEE 47th Annual International Reliability Physics Symposim, Montreal, pp. 206-211 (2009).
Kou, Y. et al. "Low Density Parity Check Codes Based on Finite Geometrics: A Rediscovery and New Results", IEEE Transactions on Information Theory, vol. 47, No. 7, pp. 2711-2736 (Nov. 2001).
Paccagnella, A. "Single Event Effects: SRAM", Dipartimento di Ingegneria dell'Informazione Universita di Padova, 33 pgs., retrieved from the internet at: sirad.pd.infn.it/scuola_legnaro_2007/Presentazioni.../12_Paccagnella_ParteB.pdf (Mar. 29, 2007).
Baumann, R. C. "Radiation-Induced Soft Errors in Advanced Semiconductor Technologies", IEEE Transactions on Device and Materials Reliability, vol. 5, No. 3, pp. 305-316 (Sep. 2005).
Hsiao, M.Y., "Class of Optimal Minimum odd-Weight-column SEC-DED Codes", IBM Journal of Research and Development, vol. 14, No. 4, Jul. 1970, pp. 395-401.
Office Action for related U.S. Appl. No. 14/820,417 (dated Oct. 5, 2016).
Office Action for related U.S. Appl. No. 14/820,436 (dated Nov. 18, 2016).
Notice of Allowance for related U.S. Appl. No. 14/820,417 (dated Feb. 14, 2017).
Office Action for related U.S. Appl. No. 14/820,436 (dated May 19, 2017).
Notice of Allowance for related U.S. Appl. No. 14/820,417 (dated May 31, 2017).
Advisory Action for related U.S. Appl. No. 14/820,436 (dated Aug. 17, 2017).
Office Action for related U.S. Appl. No. 14/820,436 (dated Oct. 5, 2017).
Office Action for counterpart EP Patent Appln. No. 16180734.2 (dated Jan. 18, 2018).
Office Action for related EP Patent Appln. No. 16180733.4 (dated Jan. 18, 2018).
Notice of Allowance for related U.S. Appl. No. 14/820,436 (dated Apr. 23, 2018).
Notice of Allowance for related U.S. Appl. No. 14/820,436 (dated Oct. 10, 2018).
Corrected Notice of Allowability for related U.S. Appl. No. 14/820,436 (dated Feb. 4, 2019).

* cited by examiner

| VOLTAGE VALUE READ FROM BIT CELL | 1-BIT DIGITIZATION VALUES | MULTI-LEVEL DIGITIZATION VALUES |
| --- | --- | --- |
| 0.8V | 1 | 8/1010 |
| 0.7V | 1 | 7/0111 |
| 0.6V | 1 | 6/0110 |
| 0.5V | 1 | 5/0101 |
| 0.4V | 0 | 4/0100 |
| 0.3V | 0 | 3/0011 |
| 0.2V | 0 | 2/0010 |
| 0.1V | 0 | 1/0001 |
| 0.0V | 0 | 0/0000 |

INTEGRATED CIRCUIT DEVICE AND METHOD FOR READING DATA FROM AN SRAM MEMORY

BACKGROUND

Static random access memory (SRAM) utilizes transistors to retain bits of data in a memory array. In order to retain the bits of data, a voltage is applied to the SRAM. Traditionally, the voltage needed to retain bits of data accurately and compensate for SRAM leakage is referred to as the data retention voltage (DRV). In low-power devices, the DRV needed to compensate for SRAM leakage can significantly contribute to the total power consumption of the device.

SUMMARY

In accordance with an embodiment of the invention, an IC device is disclosed. In the embodiment, the IC device includes an array of bit cells of static random-access memory (SRAM), a multi-level digitization module configured to generate a value in a range of values from a bit cell in the array of bit cells, the range of values including more than two discrete values, an output buffer configured to store the generated values, and an error correction code (ECC) decoder configured to output error corrected values based on the stored values.

In another embodiment, the multi-level digitization module is configured to generate a value from a bit cell based on pre-defined thresholds.

In another embodiment, the output buffer is configured with a plurality of registers to store a generated value.

In another embodiment, the ECC decoder is further configured to output the error corrected values based on the probability of bit cells in the SRAM module having slipped as indicated by the values generated by the multi-level digitization module.

In another embodiment, the ECC decoder is further configured to utilize information stored in a built-in self-test to output error corrected values.

In another embodiment, the ECC decoder is further configured to write information regarding the error correction process back to a built-in self-test.

In a second embodiment, a method for reading data from an array of bit cells of an SRAM memory in an IC device is disclosed. In the embodiment, the method involves measuring characteristics of bit cells in the array of bit cells, generating values in a range of values from the measurements, the range of values including more than two discrete values, storing the generated values in an output buffer, performing error correction on the stored values, and outputting the corrected values.

In another embodiment, generating values involves outputting a value corresponding to a voltage of a bit cell as determined by pre-defined voltage thresholds.

In another embodiment, storing the generated value involves storing the generated value in two or more registers.

In another embodiment, performing error correction on the stored value involves converting the stored value from a floating-point number to a single binary number.

In another embodiment, characteristics of bits cells are measured once per read operation.

In another embodiment, performing error correction further involves using the probability that a bit cell has slipped as indicated by the values generated from the measurements in the performance of error code correction.

In another embodiment, performing error correction further involves utilizing information stored in a built-in self-test.

In another embodiment, outputting the corrected values further involves writing information regarding the error correction process back to a built-in self-test.

In a third embodiment, an integrated circuit (IC) device is disclosed. In the embodiment, the IC device includes a plurality of bit cells of SRAM, a multi-level digitization module configured to generate a value in a range of values based on a voltage of a bit cell in the plurality of bit cells, the range of values including more than two discrete values, an output buffer configured to store the generated value, the output buffer having at least two registers for storing bits of the value, and an error correction code (ECC) decoder configured to output an error corrected value based on the stored value, the ECC decoder configured to use single error correction, double error detection (SECDED) coding.

In another embodiment, the multi-level digitization module is configured to generate a value based on the relation of the voltage of the bit cell to pre-defined thresholds.

In another embodiment, the output buffer is configured with a plurality of registers to store a value of the values.

In another embodiment, the ECC decoder is further configured to output the error corrected values based on the probability that a bit cell in the plurality of bit cells of SRAM has slipped as indicated by the values generated by the multi-level digitization module.

In another embodiment, the ECC decoder is further configured to utilize information stored in a built-in self-test to output error corrected values.

In another embodiment, the ECC decoder is further configured to write information regarding the error correction process back to a built-in self-test.

Other aspects and advantages of embodiments of the present invention will become apparent from the following detailed description taken in conjunction with the accompanying drawings.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
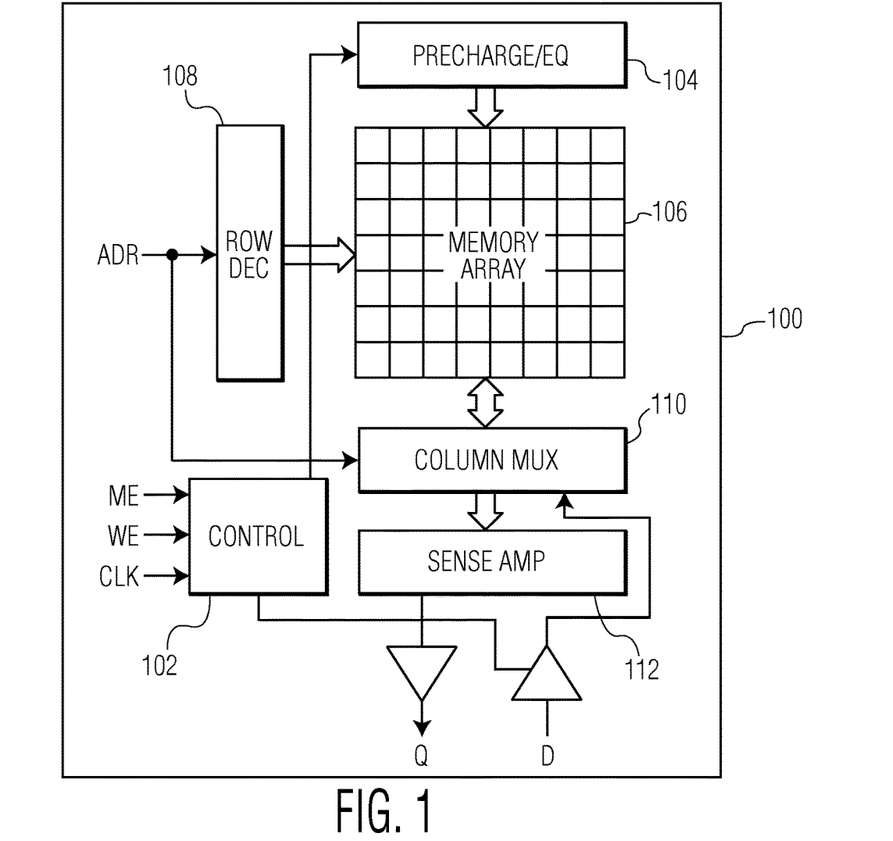
FIG. 1 illustrates a configuration of an SRAM module.

FIG. 1 illustrates a configuration of an SRAM module 100. The SRAM module includes a control circuit 102, a charge source 104 ("PRECHARGE/EQ"), a memory array 106, a row decoder 108, a column multiplexer 110, and a sense amplifier 112. The control circuit is configured to determine if data is being written to or read from the memory array when memory is accessed. In an embodiment, the memory array is an array of six transistor SRAM bit cells, but other configurations, such as a 7 transistor or a 9 transistor array, are equally applicable. In order to read from or write to the bit cells in the memory array, the charge source precharges one or more bitlines within each bit cell. The row decoder is used to select bit cells to write to and, in conjunction with the column multiplexer, to read stored data from select bit cells. Unlike DRAM, the data stored in each bit cell of an SRAM module can be sustained without regularly refreshing the data so long as sufficient power remains available to the memory array. In an embodiment, the minimum sufficient power to sustain data in SRAM is referred to as the data-retention voltage (DRV).

Figure 2:
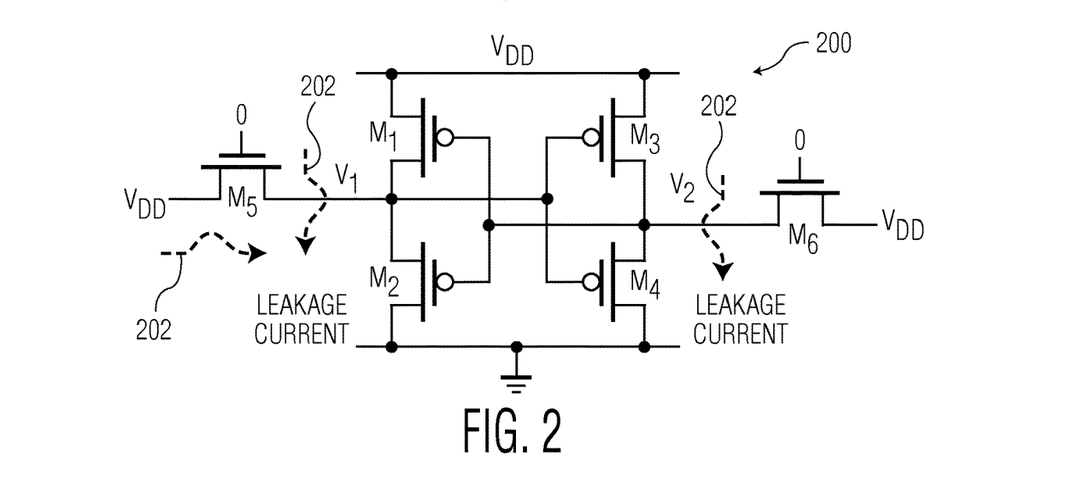
FIG. 2 depicts a circuit diagram of a 6-transistor bit cell in an SRAM module.

FIG. 2 depicts a circuit diagram of a bit cell 200 in an SRAM module. Transistors $M_1$-$M_6$ can be opened or closed in the operation of storing charge within the cell. As long as the supply voltage provided to the SRAM module stays above the DRV, the bit stored within the cells of the SRAM module can be reliably sustained due to stability of a latch formed by transistors $M_1$-$M_4$. If the supply voltage is decreased below the DRV, then the latch may not remain stable and the bit stored within the cells of the SRAM module can become unreliable. Thus, the power demand of an SRAM module during data-retention mode is largely determined by the DRV. In an embodiment, the DRV is impacted by leakage (loss of energy from charged capacitors within the transistors), as indicated by the dash line arrows 202. Voltage lower than the DRV can be applied to the SRAM memory, but doing so increases the chance for the for stored bit to become unreliable.

Figure 3:
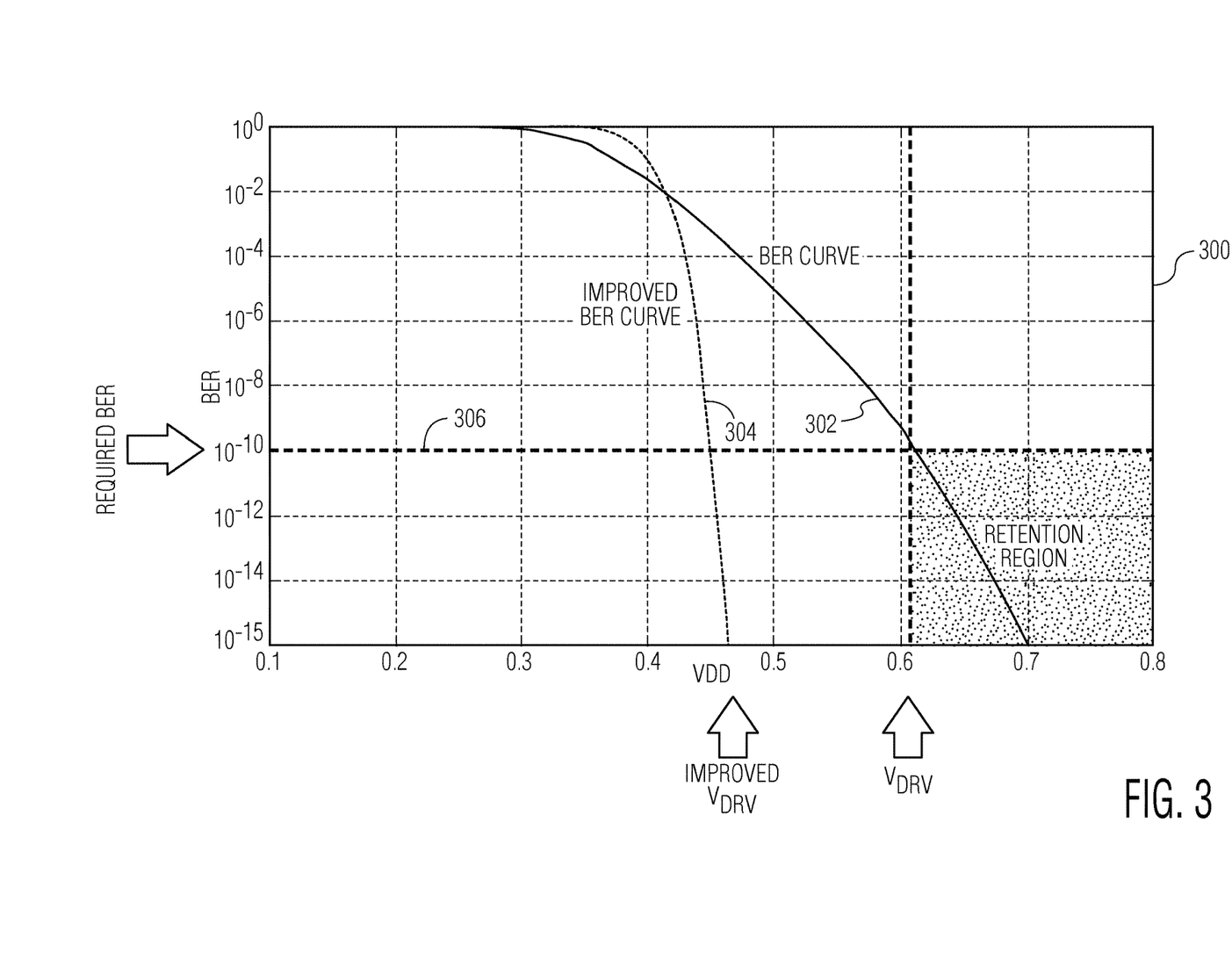
FIG. 3 is a plot of bit error rates (BER) of stored data measured across a range of DRVs.

In an embodiment, applying error correction to data read from an SRAM module allows for a lower DRV to be used during a data retention state, while still reliably sustaining the bit stored within the cells of an SRAM module. FIG. 3 is a plot 300 of bit error rates (BER) of stored data measured across a range of DRVs. The plot indicates a curve when error correction is not used 302, a curve when error correction is used 304, and a threshold BER 306 under which data must stay in order to be reliable. As indicated by the plot, when error correction is not used, the DRV must remain higher, to keep the BER above the threshold, than when error correction is used. Accordingly, by utilizing error correction, the DRV can be reduced and less voltage will need to be applied to the SRAM module to sustain reliable charge in the SRAM cells.

Typically, the voltage (or another characteristic such as current) of bit cells that store a code word (e.g., a 32-bit word) can be converted to a 1 or a 0 by an analog-to-digital converter (ADC) based on a single pre-defined threshold. For example, if the voltage of a bit cell is measured at over 0.5V, then the ADC outputs a "1" and if the voltage of the bit cell is measured at 0.5V or less, then the ADC outputs a "0". This process is performed for each bit cell that stores a bit of a particular code word. Once the voltage of each bit cell has been converted to a 1 or a 0, error correction using error correction codes (ECC) can be applied to the code word to determine if one or more of the bits in the code word have slipped (e.g., erroneous gain or drop in voltage or current of a bit cell caused by a voltage or current drift) and to correct the slipped bit. Many different techniques can be used to apply error correction to an SRAM module in an integrated circuit (IC) device. For example, a technique can utilize parity bits appended to the end of a code word to determine if the bits in the code word are correct. However, converting the voltage of a bit cell to a 1 or a 0 does not provide any indication as to the probability that the bit cell has slipped. For example, a bit cell with a voltage only 0.1 volts under a pre-defined threshold (e.g., 0.4V with a 0.5V threshold) may indicate that the bit cell was subject to voltage drift (or else the voltage would be at a maximum or minimum voltage based on the voltage source) and may have switched states (e.g., from a high voltage state to a low voltage state). However, once converted to a 0, the indication is lost. Thus, error correction typically relies on additional information, such as parity bits, to determine if a bit cell has switched states.

In accordance with an embodiment of the invention, an IC device is disclosed. In the embodiment, the IC device includes an array of bit cells of static random-access memory (SRAM), a multi-level digitization module configured to generate a value in a range of values from a bit cell in the array of bit cells, the range of values including more than two discrete values, an output buffer configured to store the generated values, and an error correction code (ECC) decoder configured to output error corrected values based on the stored values. Accordingly, the multi-level digitization module functions as an analog-to-digital converter that is able to generate a value in a range of values based on characteristics of a bit cell, thus allowing for the generated values to indicate the probability of whether a bit cell has slipped. This additional information can be used by an ECC decoder to perform better error correction than is possible by using traditional methods of error correction alone.

Figure 4:
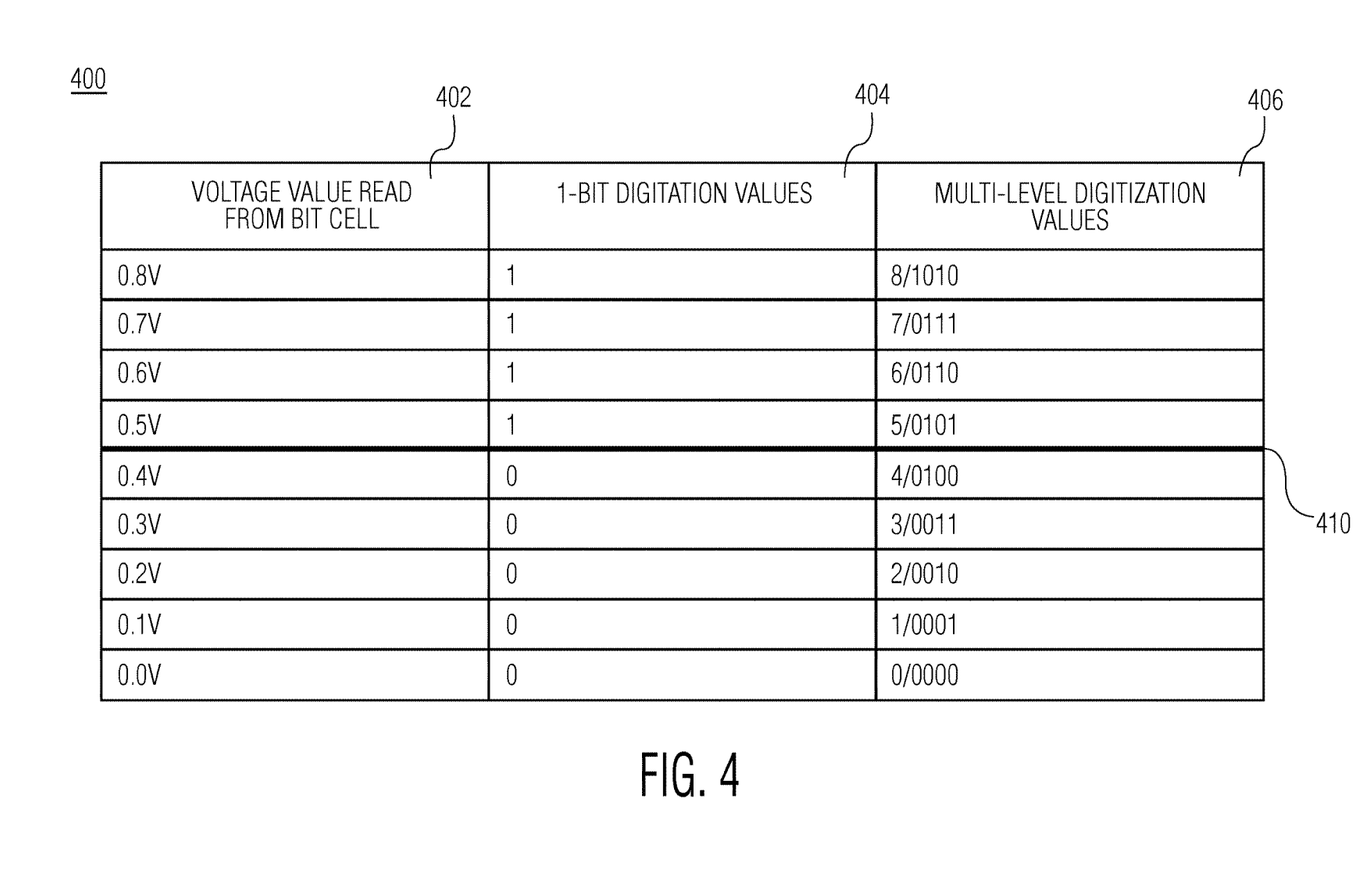
FIG. 4 is a table illustrating the correlation between the voltage of a bit cell, the values output by a 1-bit digitization module, and the values output by a multi-level digitization module.

In addition to using parity bits, as described above, by using a multi-level digitization module, multiple different multi-level digitization values can be generated based on the voltage of a bit cell to indicate the probability that the bit cell has slipped. An ECC decoder can further utilize the indication as to the probability that the bit cell has slipped to correct bit slips (e.g., to supplement traditional methods of error correction). FIG. 4 is a table 400 illustrating an example of the correlation between the voltage of a bit cell 402, the values output by a traditional analog-to-digital converter (e.g., a 1-bit digitization module with a 0.5V threshold) 404 as described above, and the values output by a multi-level digitization module 406. As illustrated, a 1-bit digitization module outputs a "1" if the voltage is above a given threshold 410 and outputs a "0" if the voltage is below the given threshold. The threshold could be increased or decreased to increase or decrease the voltage at which a "1" is output, but the threshold is constant for each read operation. Alternatively, a multi-level digitization module outputs one of a multitude of discrete values (e.g., a value selected from a range between 0 and 8 including 0, 1, 2, etc. represented as an integer or a binary word) by using multiple thresholds for each read operation. In an embodiment, the multi-level digitization module is programmable to use 2-4 bits to output a value between 0 and 15 determined, for example, by non-uniform quantization. In an embodiment, the thresholds are pre-defined by a user, but could also be automatically defined by the multi-level digitization module. Because multiple thresholds are used, each output value corresponds more closely to the actual voltage of a bit cell than when a single threshold is used and can provide a better indication as to the probability that a bit cell has slipped.

Figure 5:
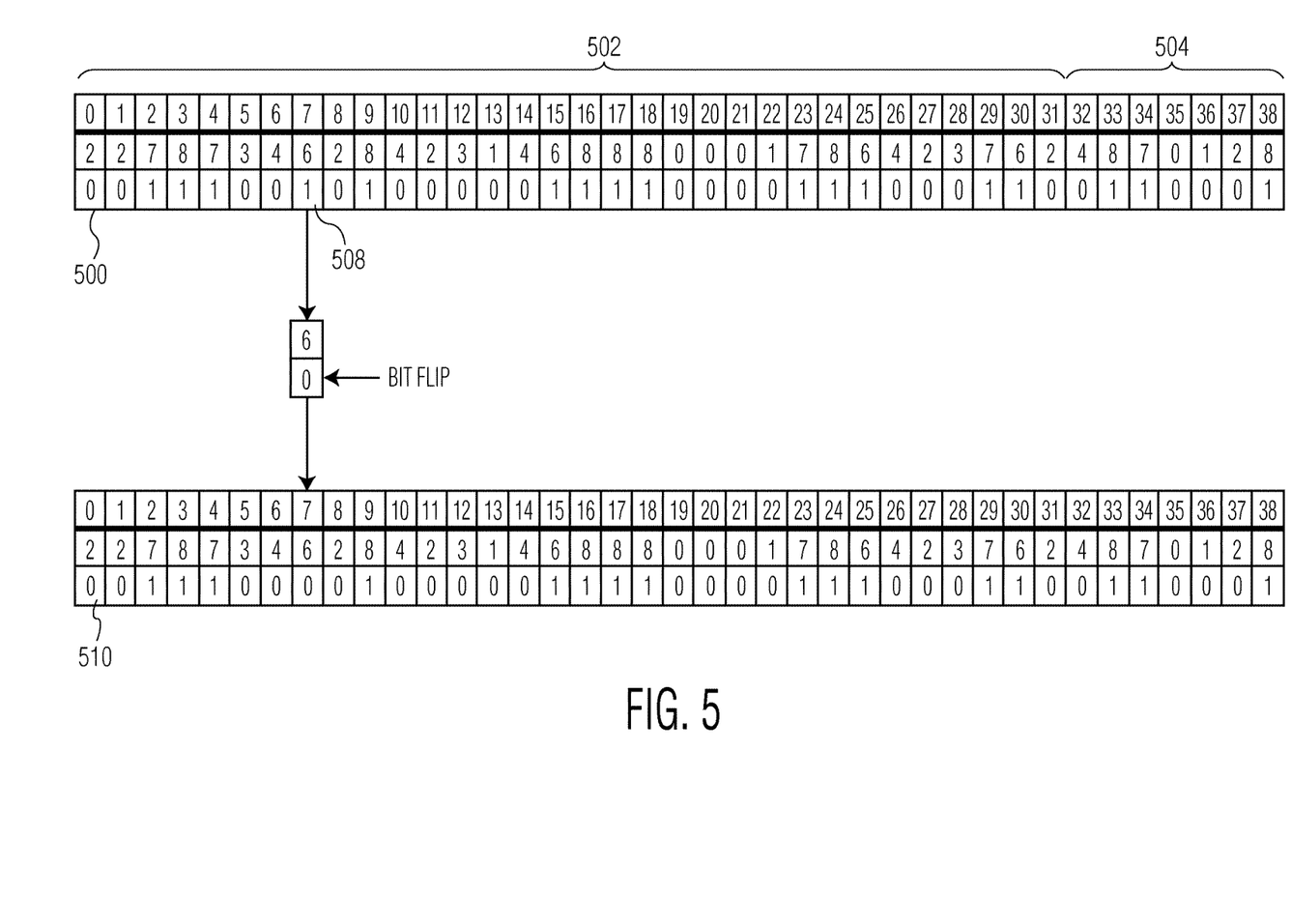
FIG. 5 illustrates the use of multi-level digitization values in performing error correction.

FIG. 5 illustrates an example use of multi-level digitization values in performing error correction. In the example of FIG. 5, an input code word 500 has 32 data bits 502 and 7 parity bits 504 and each bit has a multi-level digitization value (middle row) and a corresponding 1-bit digitization value (bottom row). For example, the first bit cell has a voltage of 0.2V, which corresponds to a multi-level digitization value of 2 and a 1-bit digitization value of "0" (because the value falls below a threshold of 5). In the example of FIG. 5, when error correction is performed, it is determined that a bit in the first 8 bits has slipped (e.g., by a method of error correction). By considering the multi-level digitization values of the input code word (specifically the first 8 bits), it is likely that the 8th bit (bit 7) 508 has slipped because it is closest to the threshold (6 is only 1 away). Accordingly, the error correction process can flip the 8th bit from a "1" to a "0" (despite its multi-level digitization value) to output a corrected code word 510. In an embodiment, multi-level digitization values can be used to increase the minimum distance (e.g., the number of bits that can slip before error correction can no longer be performed). For example, hamming codes typically have a minimum distance of 3 (e.g., a maximum of 3 bits can slip), but could be increased to 4 without the use of an additional parity bit by considering the multi-level digitization value. Additionally, multi-level digitization can be used when decoding a complete block. For example, if the 8th bit (bit 7) has slipped and now has a multi-level digitization value of 5 (e.g., right at the threshold and could be either a 1 or a 0), then the error correction process can perform correction when the 8th bit is a 1 and when the 8th bit is a 0 and compare the error corrected results to select the better result (e.g., the result in which more errors have been corrected).

Figure 6:
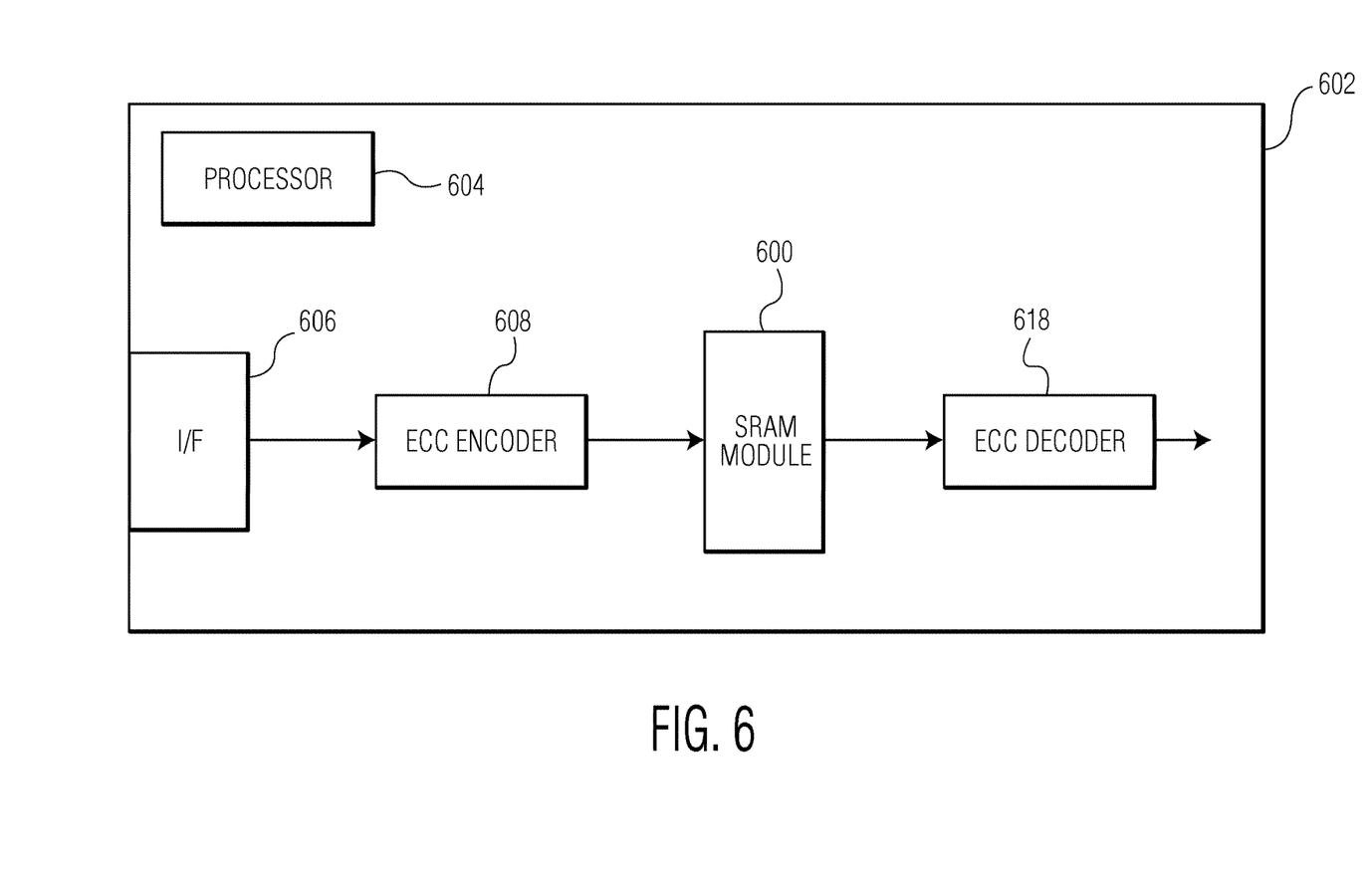
FIG. 6 depicts an IC device configured to utilize a multi-level digitization module in accordance with an embodiment of the invention.

FIG. 6 depicts an IC device 602 configured to utilize a multi-level digitization module in accordance with an embodiment of the invention. In an embodiment, the IC device includes a processor 604, an interface 606, an ECC encoder 608, an SRAM module 600, and an ECC decoder 618. The SRAM module further includes a system for generating multi-level digitization values (e.g., outputs generated by a multi-level digitization module) as described below. In other embodiments, the system for generating multi-level digitization values can be external to the SRAM module. In an embodiment, when data is written to the SRAM module, the data is received via the interface, passed to the processor for processing, and passed to the ECC encoder for encoding. In an embodiment, the data can be received from within the IC device without being received via the interface and the ECC encoder can be implemented by the processor. The processor can be, for example, an ARM processor and the interface can be, for example, a serial interface, such as an I2C interface, and/or a wireless interface. Once the data is encoded, it can be written to the SRAM module (e.g., as a 39-bit code word with 32 data bits and 7 parity bits). In an embodiment, when data is read from the SRAM module, the data is passed through the system for generating multi-level digitization values to the ECC decoder, decoded and/or corrected, and output for further use. In an embodiment, the data can be output to the interface for use external to the IC device or can be output to other components (not shown) within the IC device.

Figure 7:
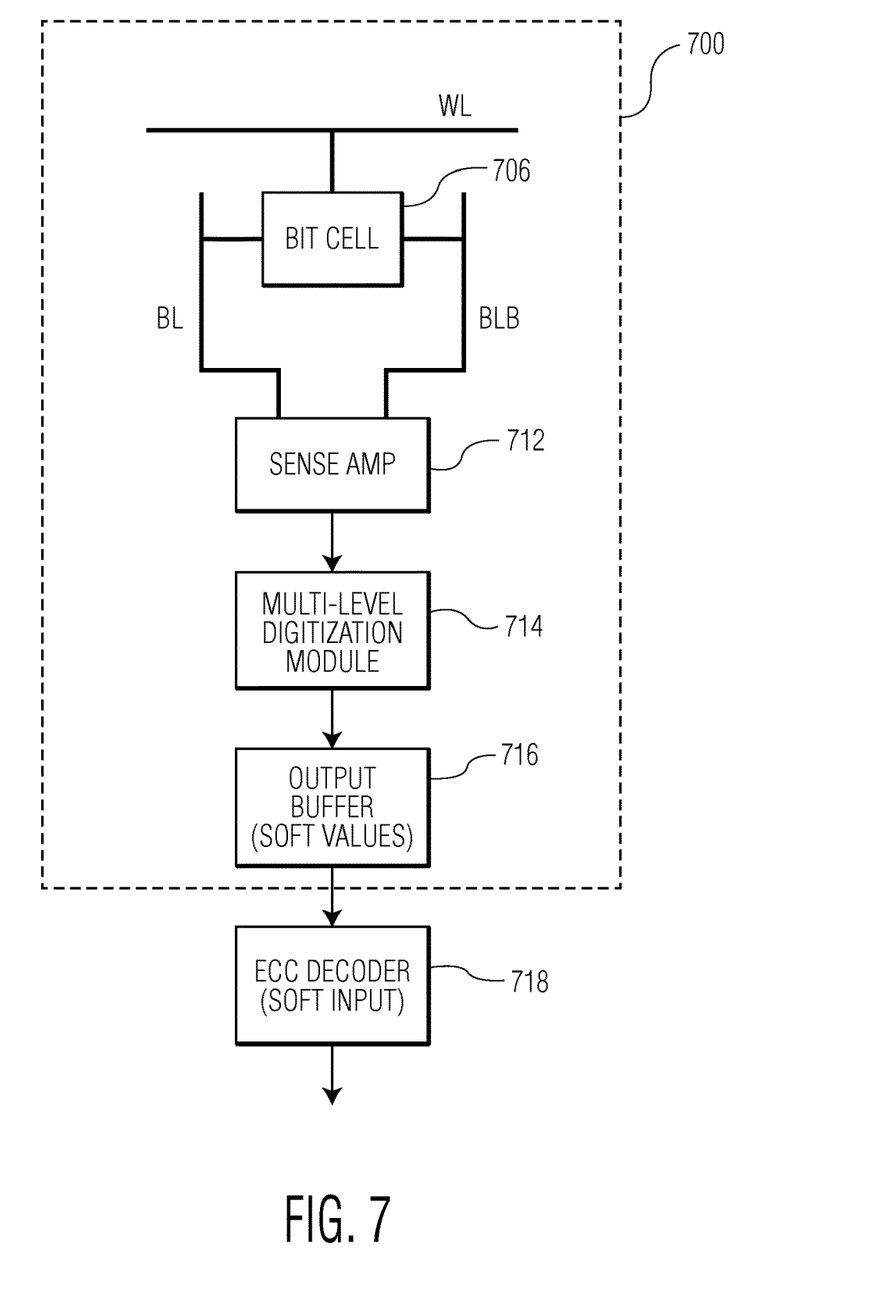
FIG. 7 depicts an embodiment of a system for generating multi-level digitization values in accordance with an embodiment of the invention.

FIG. 7 depicts an embodiment of a system for generating multi-level digitization values in accordance with an embodiment of the invention. The system includes a bit cell 706 of SRAM, a sense amp 712, a multi-level digitization module 714, an output buffer 716, and an ECC decoder 718. In an embodiment, the bit cell, sense amp, multi-level digitization module, and output buffer are part of the SRAM module 700 and the output butter is connected so as to output multi-level digitization values to the ECC decoder. FIG. 7 depicts a system with a single bit cell, but multiple systems could exist in parallel (e.g., one system per bit in a 32-bit word) or the multi-level digitization module could be coupled to sense amps for multiple bit cells that are then serially processed. With respect to FIG. 7, in an example operation, a bit is read from the bit cell along a bitline (indicated by "BL"), amplified by the sense amp, and passed to the multi-level digitization module for conversion to a multi-level digitization value (as described above with reference to FIG. 4) corresponding to, for example, the voltage of the bit cell. For example, with respect to FIG. 4, when a bit with a voltage of 0.4V is read from a bit cell, a multi-level digitization value of 4 or its binary equivalent of 0100 will be generated. In an embodiment, the multi-level digitization module can be implemented with an analog-to-digital converter (ADC), such as a flash ADC, but could also be implemented by repeated 1-bit sampling. The ADC is configured with several output levels or states and the output from the multi-level digitization module can then be passed to the output buffer, which is configured to store the generated values in a plurality of registers. For example, an output buffer can receive the generated values and then drive the values to the ECC decoder either in parallel (e.g., drive the 4-bit multi-level digitization values for all of the 39-bits of an encoded code word at once) or serially (e.g., drive each 4-bit multi-level digitization value for each bit of the 39-bit encoded code word 4-bits at a time). In an embodiment, the output buffer is implemented with at least one operational amplifier (op-amp) that drives the output from the multi-level digitization module to the ECC decoder. In an embodiment, the ECC decoder is implemented in hardware circuitry configured to facilitate ECC-algorithm functionality and/or to store microcode to be executed by a microprocessor to perform error correction. The ECC decoder performs error correction using, for example, hamming coding or single error correction, double error detection coding (SECDED), and outputs a single error corrected hard-bit representation (e.g., a 1 or a 0) of the voltage of the bit cell in the code word to form a decoded 32-bit data word. For example, the multi-level digitization value of "0100" will be output as a "0".

Figure 8:
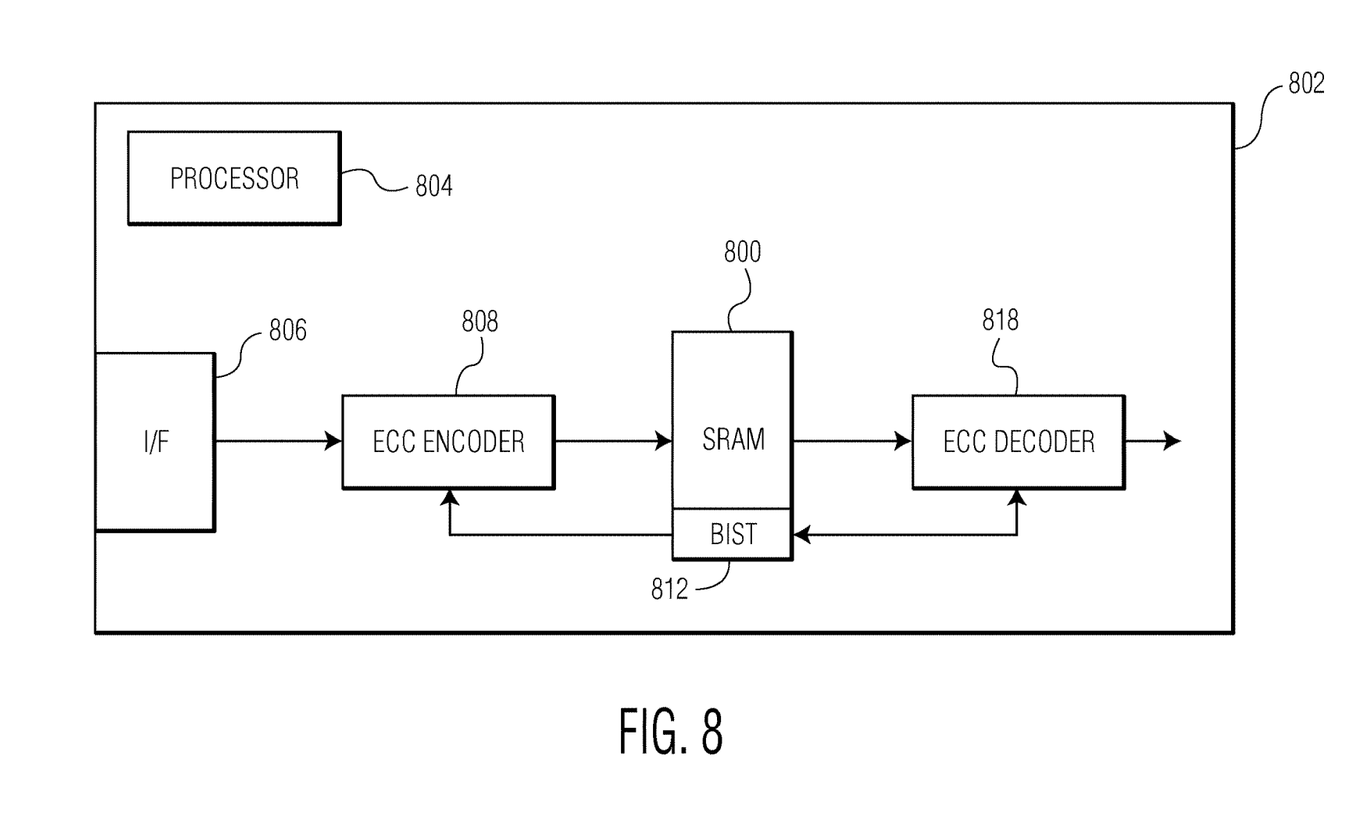
FIG. 8 depicts an IC device configured to utilize a multi-level digitization module and a built-in self-test (BIST) in accordance with an embodiment of the invention.

In addition to performing error correction using multi-level digitization values, data regarding the health of a bit cell can be used by the ECC decoder to perform error correction. FIG. 8 depicts an IC device 802 configured to utilize a multi-level digitization module and a built-in self-test (BIST) 812 in accordance with an embodiment of the invention. In an embodiment, the IC device includes a processor 804, an interface 806, an SRAM module 800 including the BIST, and an ECC decoder 818. In an embodiment, when data is written to the SRAM module, the data is received via the interface, passed to the processor for processing, and passed to the ECC encoder for encoding. In an embodiment, the data can be received from within the IC device without being received via the interface and the ECC encoder can be implemented by the processor. The processor can be, for example, an ARM processor and the interface can be, for example, a serial interface, such as an I2C interface, and/or a wireless interfaces. Once the data is encoded (e.g., the addition of 7 parity bits to the end of a 32-bit code word), it can be written to the SRAM module. In an embodiment, when the first data read operation is performed, data is passed to the ECC decoder and decoded as described with reference to FIGS. 6 and 7. The results of the ECC decoding process (e.g., which, if any, bit cells slipped) is recorded by the BIST. In an embodiment, the BIST can be facilitated either by hardware (e.g., additional circuitry on the SRAM module) or by software (e.g., software configuration of part of the SRAM module). If the BIST is facilitated by hardware, then, for example, the results of the ECC decoding process is a list of addresses of bits that are identified as weak that is stored in additional circuitry of the SRAM module. If the BIST is facilitated by software, then, for example, the results of the ECC decoding process is a table of bits and a health status corresponding to each bit (e.g., strong or weak) that is written to the SRAM memory. On subsequent read operations, data is passed to the ECC decoder, but additional data regarding the health of bit cells (e.g., number of instances in which each bit cell has previously slipped) is passed from the BIST to the ECC decoder as well and the result of the ECC decoding process is recorded by the BIST. In an embodiment if the BIST indicates that a bit cell has a history of slipping, then the ECC decoder will favor correction of that bit cell over a bit cell with no history of slipping. In an embodiment, after data is decoded by the ECC decoder the data can be output to the interface for use external to the IC device or can be output to other components (not shown) within the IC device. Additionally, when writing data, information from the BIST can be used by the ECC encoder to avoid writing the data to bit cells with a history of slipping.

Figure 9:
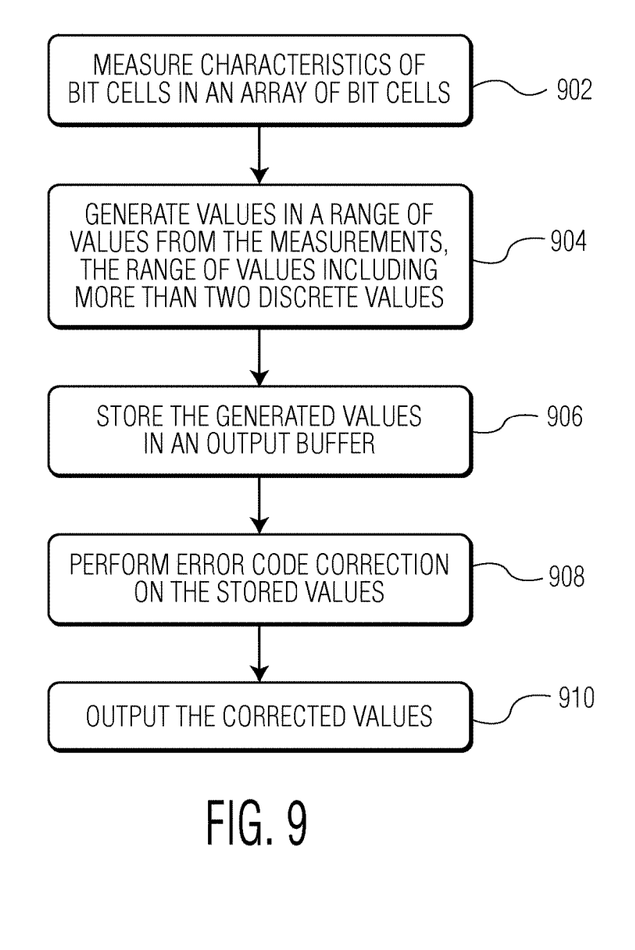
FIG. 9 is a process flow diagram of a method for reading data from an array of bit cells of an SRAM memory in an IC device in accordance with an embodiment of the invention.

FIG. 9 is a process flow diagram of a method for reading data from an array of bit cells of an SRAM memory in an IC device in accordance with an embodiment of the invention. At block 902, characteristics of bit cells in an array of bit cells are measured. In an embodiment, the voltage of each bit cell is measured and amplified via a sense amp. At block 904, values in a range of values are generated from the measurements, the range of values including more than two discrete values. In an embodiment, the values are multi-level digitization values (e.g., a range of integer values between 0 and 8) generated based on the voltage of each bit cell. At block 906, the generated values are stored in an output buffer. In an embodiment, the generated values are stored temporarily and driven to an ECC decoder using at least one op-amp. At block 908, error correction is performed on the stored values. In an embodiment, the error correction is performed by an ECC decoder. At block 910, the error corrected values are output for use by, for example, an application. In an embodiment, information regarding the error correction process is also written back to a BIST at block 910. The information written back to the BIST can be used in subsequent read and/or write operations.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An integrated circuit (IC) device comprising:
an array of bit cells of static random-access memory (SRAM);
a sense amplifier configured to sense a respective voltage level at each bit cell in the array of bit cells, wherein the respective voltage level falls within one of a group of ranges that includes at least a first voltage range representing a first state and a second voltage range representing a second state;
a multi-level digitization module configured to generate a respective digital value based on the respective voltage level for each bit cell in the array of bit cells, wherein the first voltage range is subdivided into a first set of voltage subranges, the second voltage range is subdivided into a second set of voltage subranges, each voltage subrange of the first and second sets of voltage subranges is associated with one of a plurality of predetermined digital values, the plurality of predetermined digital values includes more than two discrete values, and a particular predetermined digital value that is associated with a particular voltage subrange that includes the respective voltage level is generated as the respective digital value;
an output buffer configured to store the generated digital values; and
an error correction code (ECC) decoder configured to output error corrected values based on the stored digital values.

2. The IC device of claim 1, wherein the output buffer is configured with a plurality of registers to store each generated digital value.

3. The IC device of claim 1, wherein the ECC decoder is further configured to output the error corrected values based on the probability of bit cells in the SRAM module having slipped as indicated by the digital values generated by the multi-level digitization module.

4. The IC device of claim 1, wherein the ECC decoder is further configured to utilize information stored in a built-in self-test to output error corrected values.

5. The IC device of claim 1, wherein the ECC decoder is further configured to write information regarding the error correction process back to a built-in self-test.

6. A method for reading data from an array of bit cells of an SRAM memory in an IC device, the method comprising:
measuring characteristics of bit cells in the array of bit cells, wherein a respective measurement value of each bit cell corresponds to one of a group of data retention states that includes at least a first state and a second state;
generating digital values for the bit cells in the array of bit cells, wherein a respective digital value is based on the respective measurement value for each bit cell, each of a plurality of measurement subranges is associated with one of a plurality of predetermined digital values, the plurality of predetermined digital values includes more than two discrete values, and a particular predetermined digital value that is associated with a particular measurement subrange that includes the respective measurement value is generated as the respective digital value;
storing the generated digital values in an output buffer;
performing error correction on the stored digital values; and
outputting the corrected values.

7. The method of claim 6, wherein the generating digital values involves outputting a digital value corresponding to a voltage level of a bit cell as determined by pre-defined voltage thresholds.

8. The method of claim 6, wherein storing the generated digital value involves storing the generated digital value in two or more registers.

9. The method of claim 6, wherein performing error correction on the stored digital value involves converting the stored digital value from a floating-point number to a single binary number.

10. The method of claim 6, wherein characteristics of bits cells are measured once per read operation.

11. The method of claim 6, wherein performing error correction further involves using the probability that a bit cell has slipped as indicated by the digital values generated from the measurements in the performance of error code correction.

12. The method of claim 6, wherein performing error correction further involves utilizing information stored in a built-in self-test.

13. The method of claim 6, wherein outputting the corrected values further involves writing information regarding the error correction process back to a built-in self-test.

14. An integrated circuit (IC) device comprising:
a plurality of bit cells of SRAM;
a sense amplifier configured to sense a respective voltage level at each bit cell, wherein the respective voltage level falls within one of a group of ranges that includes at least a first voltage range representing a first data retention state and a second voltage range representing a second data retention state;
a multi-level digitization module configured to generate a respective digital value based on the respective voltage level of each bit cell in the plurality of bit cells, wherein the first voltage range is subdivided into a first set of voltage subranges, the second voltage range is subdivided into a second set of voltage subranges, each voltage subrange of the first and second sets of voltage subranges is associated one of a plurality of predetermined digital values, the plurality of predetermined digital values including more than two discrete values, and a particular predetermined digital value that is associated with a particular voltage subrange that includes the respective voltage level is generated as the respective digital value;
an output buffer configured to store the generated digital value, the output buffer having at least two registers for storing bits of the digital value; and
an error correction code (ECC) decoder configured to output an error corrected value based on the stored digital value, the ECC decoder configured to use single error correction, double error detection (SECDED) coding.

15. The IC device of claim 14, wherein the multi-level digitization module is configured to generate a digital value based on the relation of the voltage level of the bit cell to pre-defined thresholds.

16. The IC device of claim 14, wherein the ECC decoder is further configured to output the error corrected values based on the probability that a bit cell in the plurality of bit cells of SRAM has slipped as indicated by the digital values generated by the multi-level digitization module.

17. The IC device of claim 14, wherein the ECC decoder is further configured to utilize information stored in a built-in self-test to output error corrected values.

18. The IC device of claim 14, wherein the ECC decoder is further configured to write information regarding the error correction process back to a built-in self-test.

19. The IC device of claim 14, wherein the first state is associated with two or more predetermined digital values.

20. The IC device of claim 3, wherein digital values corresponding to voltage subranges closest to a voltage threshold between states may indicate the respective voltage level stored by the bit cell has slipped.

* * * * *